(12) United States Patent  (10) Patent No.: US 9,093,169 B2
Yang et al.  (45) Date of Patent: Jul. 28, 2015

(54) NONVOLATILE SEMICONDUCTOR MEMORY APPARATUS AND DATA SENSING METHOD THEREOF

(75) Inventors: Chang Won Yang, Icheon-si (KR); Hwang Huh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 305 days.

(21) Appl. No.: 13/584,990

(22) Filed: Aug. 14, 2012

(65) Prior Publication Data

US 2013/0208538 A1 Aug. 15, 2013

(30) Foreign Application Priority Data

Feb. 10, 2012 (KR) ........................ 10-2012-0013739

(51) Int. Cl.
*G11C 16/28* (2006.01)
*G11C 11/24* (2006.01)
*G11C 7/04* (2006.01)
*G11C 7/08* (2006.01)
*G11C 7/10* (2006.01)
*G11C 11/56* (2006.01)

(52) U.S. Cl.
CPC ...... *G11C 11/24* (2013.01); *G11C 7/04* (2013.01); *G11C 7/08* (2013.01); *G11C 7/106* (2013.01); *G11C 11/5642* (2013.01); *G11C 16/28* (2013.01)

(58) Field of Classification Search
CPC ..................................................... G11C 16/28
USPC ............. 365/185.21, 185.2, 189.15, 196, 205
See application file for complete search history.

(56) References Cited

U.S. PATENT DOCUMENTS

| | | | | |
|---|---|---|---|---|
| 6,304,486 | B1* | 10/2001 | Yano | 365/185.22 |
| 7,023,736 | B2* | 4/2006 | Cernea et al. | 365/185.21 |
| 2003/0099133 | A1* | 5/2003 | Won et al. | 365/185.21 |
| 2005/0265061 | A1* | 12/2005 | Kim | 365/49 |
| 2006/0158947 | A1 | 7/2006 | Chan et al. | |
| 2007/0247928 | A1* | 10/2007 | Park | 365/189.05 |
| 2008/0170441 | A1* | 7/2008 | Pelli et al. | 365/185.21 |
| 2008/0247237 | A1* | 10/2008 | Abe | 365/185.21 |

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A nonvolatile semiconductor memory apparatus includes a memory cell block, a plurality of page buffers, and a reference page buffer unit. The memory cell block includes a plurality of memory cell strings each of which includes a plurality of memory cells and a dummy memory cell string which includes a plurality of dummy memory cells. The page buffers sense data stored in the memory cells and apply the sensed data to an output node. The reference page buffer unit senses the dummy memory cells and adjusts the timing to apply the values sensed by the page buffers to the output node.

14 Claims, 5 Drawing Sheets

NONVOLATILE SEMICONDUCTOR MEMORY APPARATUS AND DATA SENSING METHOD THEREOF

CROSS-REFERENCES TO RELATED APPLICATION

The present application claims priority under 35 U.S.C. §119(a) to Korean application number 10-2012-0013739 filed on Feb. 10, 2012 in the Korean Intellectual Property Office, which is incorporated herein by reference in its entirety as set forth in full.

BACKGROUND

1. Technical Field

The present invention relates generally to a semiconductor memory apparatus, and more particularly, to a page buffer control of a nonvolatile semiconductor memory apparatus.

2. Related Art

Generally, a semiconductor memory apparatus may be considered to be either a volatile memory type, such as a DRAM, an SRAM, or the like, or a nonvolatile memory type, such as an EEPROM, an FRAM, a PRAM, an MRAM, a flash memory apparatus, or the like. The volatile memory apparatus may lose stored data when power is cut off, but the nonvolatile memory apparatus may preserve stored data even after power is not supplied. Since the flash memory apparatus has advantages such as high programming speed, low power consumption, mass data storage, and the like, it has been widely used as a storage medium in a computer system or the like.

Figure 1:
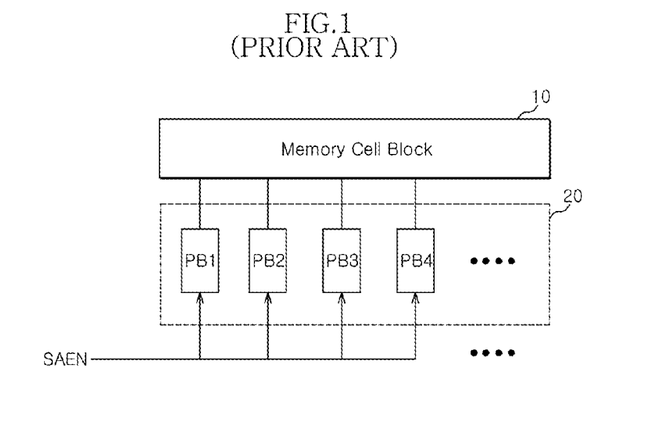
FIG. 1 is a schematic diagram showing the configuration of a nonvolatile semiconductor memory apparatus.

FIG. 1 is a typical configuration diagram of a NAND flash memory apparatus of the nonvolatile memory type.

The NAND flash memory apparatus in the related art includes a memory cell block 10 and a page buffer unit 20.

In the memory cell block 10, a plurality of memory cells for storing data are connected in the form of a matrix between word lines for selecting and activating the memory cells and bit lines for inputting and outputting data of the memory cells.

The page buffer unit 20 includes a plurality of page buffers PB1, PB2, etc. that are connected to the memory cells through the bit lines, and the respective page buffers PB1, PB2, etc. may provide program data to the selected memory cells or sense and store data from the selected memory cells.

A sensing output signal SAEN that is applied to the page buffer unit 20 may serve to adjust the activation timing of the page buffer unit 20 during a read operation. Here, the activation timing refers to the timing to apply values being sensed to an output node. In other words, during the read operation, the page buffer unit 20 may perform an operation of sensing the data stored in the memory cells, and may apply the sensed values to the output node at a time when the sensing output signal SAEN activated during a data sensing process is applied.

Since the sensing operation is a continuous operation, the data value read may differ depending on at which time the sensed value is captured. If the page buffer unit 20 cannot sufficiently ensure a read margin during the read operation, the page buffer unit may erroneously read the wrong data value.

SUMMARY

In an embodiment of the present invention, a nonvolatile semiconductor memory apparatus includes a memory cell block, page buffers, and a reference page buffer unit. The memory cell block is configured to include a plurality of memory cell strings each of which includes a plurality of memory cells and a dummy memory cell string, which includes a plurality of dummy memory cells. The page buffers are configured to sense data stored in the memory cells and to apply the sensed data to an output node. The reference page buffer unit is configured to sense the dummy memory cells and to adjust the timing to apply the values sensed by the page buffer to the output node.

In an embodiment of the present invention, a nonvolatile semiconductor memory apparatus similarly includes a memory cell block, page buffers, and a reference page buffer unit. The memory cell block is configured to include a plurality of memory cell strings each of which includes a plurality of memory cells, a dummy memory cell string which includes a plurality of dummy memory cells, and a plurality of bit lines connected to the plurality of cell strings and the dummy memory cell string. The page buffers are configured to be connected to any one of the plurality of bit lines that are connected to the memory cell strings in response to a sensing signal to sense data stored in the memory cells, latch the data in response to a sensing output signal, and apply the latched data to an output node. The reference page buffer unit is configured to be connected to the bit line, which is connected to the dummy memory cell string in response to the sensing signal to sense the dummy memory cells, and to adjust the activation timing of the sensing output signal.

In an embodiment of the present invention, a data sensing method of a nonvolatile semiconductor memory apparatus includes activating a page buffer for sensing memory cells; activating a reference page buffer unit for sensing dummy memory cells; generating an activated sensing output signal via the reference page buffer based on sensing the dummy memory cells; and outputting values via the page buffer obtained by sensing the memory cells to an output node in response to the sensing output signal.

BRIEF DESCRIPTION OF THE DRAWINGS

Features, aspects, and embodiments are described in conjunction with the attached drawings, in which.

DETAILED DESCRIPTION

Hereinafter, the present invention will be described below with reference to the accompanying drawings through various embodiments.

Hereinafter, a NAND flash memory apparatus is used as an example of a nonvolatile semiconductor memory device to explain the features and functions of the present invention. However, in accordance with embodiments of the present invention, as a storage medium, a PRAM, an MRAM, a ReRAM, an FRAM, or a NOR flash memory may be used, and the present invention may be applied to a memory system in which different kinds of memory apparatuses coexist.

Figure 2:
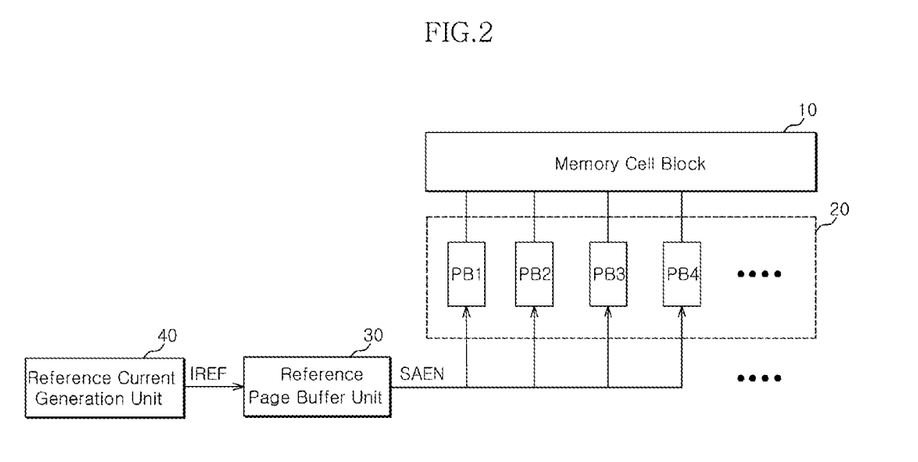
FIG. 2 is a diagram showing the configuration of a nonvolatile semiconductor memory apparatus in accordance with an embodiment of the present invention.

FIG. 2 is a diagram showing the configuration of a NAND flash memory apparatus in accordance with an embodiment of the present invention.

The NAND flash memory apparatus shown in FIG. 2 includes a memory cell block 10, a page buffer unit 20, and a reference page buffer unit 30.

In the memory cell block 10, a plurality of memory cells for storing data are connected in the form of a matrix between word lines for selecting and activating the memory cells and bit lines for inputting and outputting data of the memory cells.

The page buffer unit 20 includes a plurality of page buffers PB1, PB2, PB3, etc. that are connected to the memory cells through the bit lines, and the respective page buffers PB1, PB2, PB3, etc. may provide program data to the selected memory cells or sense and store data from the selected memory cells.

The reference page buffer unit 30 serves to adjust the activation timing of the page buffer unit 20 during a read operation. Here, the activation timing refers to the timing to apply values being sensed to an output node. In other words, during the read operation, the page buffer unit 20 may perform an operation of sensing the data stored in the memory cells, and may apply the sensed values to the output node at a time when a sensing output signal SAEN activated during a data sensing process is applied.

The reference page buffer unit 30 includes page buffers (not illustrated) having a similar configuration to the page buffers PB1, PB2, PB3, etc. included in the page buffer unit 20, and may allow a reference current IREF that is obtained by modeling cell current flowing during the data sensing operation to flow to the page buffers (not illustrated). The page buffers (not illustrated) may activate the sensing output signal SAEN at a time when the sensing operation in accordance with the reference current IREF is completed.

The sensing output signal SAEN may be applied to the page buffer unit 20 and the values that are sensed by the page buffer unit 20 may be stored and outputted when the sensor output signal SAEN is activated.

The reference page buffer unit 30 may further include a reference current generation unit 40 configured to generate the reference current IREF.

Figure 3:
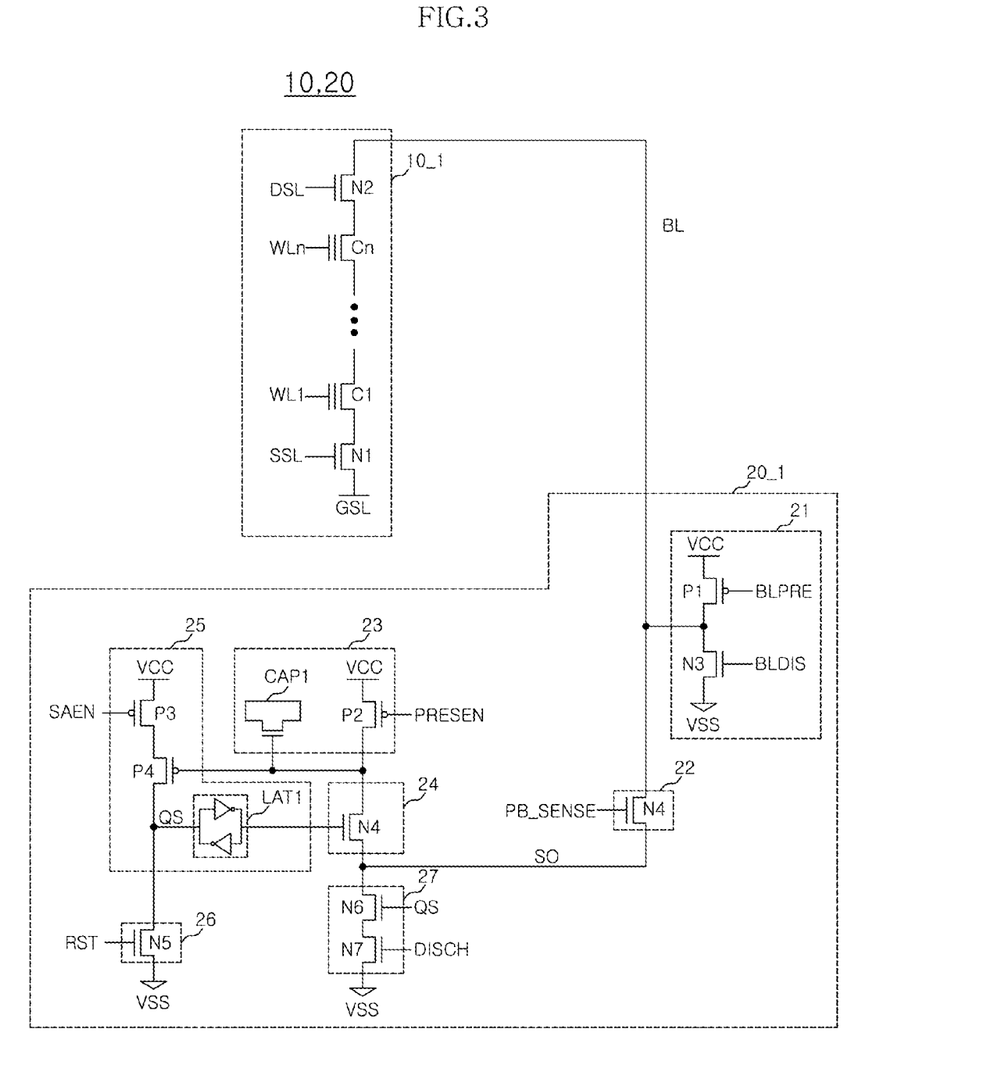
FIG. 3 is a circuit diagram showing the detailed configuration of the memory cell block and the page buffer unit shown in FIG. 2.

FIG. 3 is a circuit diagram showing the detailed configuration of the memory cell block 10 and the page buffer unit 20.

The memory cell block 10 includes a plurality of cell strings 10_1. As shown, the cell string 10_1 includes a plurality of flash memory cell transistors C1 to Cn connected in series along a bit line BL. Word lines WL1 to WLn are connected to corresponding gate terminals of the cell transistors C1 to Cn, respectively. At both ends of each cell string 10_1, control transistors N1 and N2, which control cell string selection in response to selection signals DSL, SSL, and GSL, are connected.

The page buffer unit 20 includes a plurality of page buffers 20_1 connected to the bit line BL. The page buffer 20_1 includes a precharge unit 21, a switch unit 22, a precharging unit 23, a current pass unit 24, and an output unit 25.

The precharge unit 21 precharges or discharges the bit line BL with the level of an external voltage VCC in response to precharge signals BLPRE and BLDIS. Specifically, the precharge unit 21 includes precharge transistors P1 and N3 which apply the external voltage VCC or ground voltage VSS to the bit line BL in response to the precharge signals BLPRE and BLDIS.

The switch unit 22 connects the bit line BL to a sensing node SO during the read operation. Specifically, the switch unit 22 includes a switch transistor N4 which is turned on in response to a sensing signal PB_SENSE that is activated during the read operation.

The precharging unit 23 includes a first capacitor CAP1, and charges the first capacitor CAP1 before the read operation is performed. The first capacitor CAP1 is used for sensing data stored in the memory cell. Specifically, the precharging unit 23 includes a charging transistor P2 which charges the first capacitor CAP1 through application of the external voltage VCC in response to a presensing signal PRESEN that is activated before the read operation is performed.

The current pass unit 24 senses the data through discharging of the charge stored in the first capacitor CAP1 in response to the voltage level of the sensing node SO. If the switch unit 22 is turned on during the read operation, current flows to the bit line BL in accordance with the data level programmed in the selected memory cells, and thus the voltage level of the sensing node SO is changed.

The current pass unit 24 includes a pass transistor N4. The drain terminal of the pass transistor N4 is connected to the first capacitor CAP1, and the source terminal thereof is connected to the sensing node SO. For initialization, a high level signal may be applied to the gate terminal of the pass transistor N4, and the charge that is stored in the first capacitor CAP1 may be discharged in accordance with the voltage level of the sensing node SO.

The output unit 25 latches the sensed data in response to the sensing output signal SAEN and outputs the latched data to the output node QS. In other words, the value which is sensed when the sensing output signal SAEN is applied from the reference page buffer unit 30 may be applied to the output node QS.

Specifically, the output unit 25 includes an output transistor P3, a sensing transistor P4, and a latch unit LAT1. The output transistor P3 is turned on in response to the sensing output signal SAEN to apply the external voltage VCC. The sensing transistor P4 is connected to the output transistor P3 and the output node QS, and is turned on in response to the voltage applied to the first capacitor CAP1. The latch unit LAT1 latches the data applied to the output node QS, and applies the inverted level of the data to the gate terminal of the pass transistor N4.

Thus, when the sensing output signal SAEN is activated, the data is applied to the output node QS of the output unit 25 in accordance with the charge of the first capacitor CAP1.

The operation of the page buffer 20_1 will be briefly described. Before the read operation, the page buffer 20_1 precharges the bit line with the level of the external voltage VCC and charges the first capacitor CAP1, and during the read operation, the page buffer 20_1 discharges the first capacitor CAP1 to perform the sensing operation. The page buffer 20_1 may output the sensed value when the sensing output signal SAEN is activated.

The page buffer 20_1 may further include a reset unit 26 and a discharge unit 27.

The reset unit 26 initializes the output node QS to the level of the ground voltage VSS in response to the reset signal RST. Specifically, the reset unit 26 includes a reset transistor N5 that applies the ground voltage VSS to the output node QS in response to the reset signal RST.

The discharge unit 27 discharges the sensing node SO to the level of the ground voltage VSS in response to the voltage level of the output node QS and the discharge signal DISCH. Specifically, the discharge unit 27 includes two discharge transistors N6 and N7 that apply the ground voltage VSS to the sensing node SO in response to the voltage level of the output node QS and the discharge signal DISCH.

Figure 4:
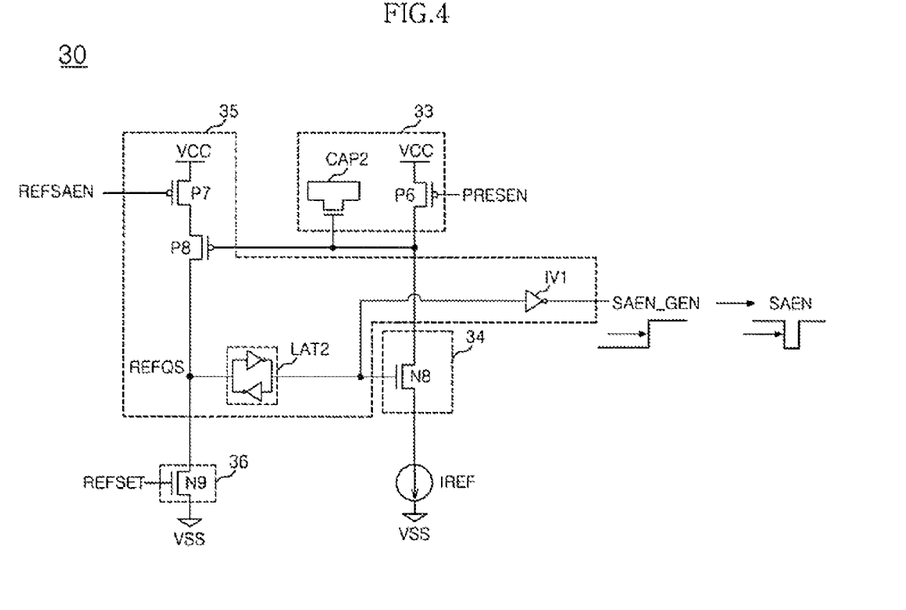
FIG. 4 is a circuit diagram showing the detailed configuration of the reference page buffer unit shown in FIG. 2.

FIG. 4 is a circuit diagram showing the detailed configuration of the reference page buffer unit 30 of the NAND flash memory apparatus.

The detailed configuration of the reference page buffer unit 30 is similar to that of the page buffer 20_1 as described above. Specifically, the reference page buffer unit 30 includes a precharging unit 33, a current pass unit 34, and an output unit 35.

The precharging unit 33 includes a second capacitor CAP2 and a charging transistor P6 which charges the second capacitor CAP2 in response to the presensing signal PRESEN that is activated before the read operation. The capacitance of the second capacitor CAP2 is equal to the capacitance of the first capacitor CAP1 so that the reference page buffer unit 30 and the page buffer unit 20 may have the same sensing conditions.

The current pass unit 34 includes a pass transistor N8 that discharges the second capacitor CAP2 according to the reference current IREF applied during the read operation.

The output unit 35 latches the sensed data in response to the reference sensing output signal REFSAEN that is activated at a predetermined timing and outputs the latched data to the output node REFQS. The output unit 35 activates the sensing output signal SAEN in response to the voltage level transition of the output node REFQS. Specifically, the output unit 35 includes an output transistor P7 that is turned on in response to the reference sensing output signal REFSAEN to apply the external voltage VCC, a sensing transistor P8 that is turned on in response to the voltage applied to the output node REFQS, a latch unit LAT2 that latches the data applied to the output node REFQS, and an inverter IV1 that buffers and negates the output of the latch unit LAT2.

The reference page buffer unit 30 may further include a reset unit 36 which includes a reset transistor N9 that initializes the output node REFQS in response to the reset signal REFSET.

The detailed operation of the reference page buffer unit 30 will be described. The reference page buffer unit 30 charges the second capacitor CAP2 in accordance with the reference voltage IREF before the read operation, and then discharges the second capacitor CAP2 in accordance with the reference current IREF when the read operation is performed. If the discharge is completed, the external voltage VSS is applied to the output node REFQS. A level transition of the sensing output drive signal SAEN_GEN is performed when the voltage level of the output node REFQS is changed, and the sensing output signal SAEN is activated when the transition of the sensing output drive signal SAEN_GEN is performed. The generation of the sensing output signal, which is a pulse signal that is activated to a low level from the sensing output drive signal SAEN_GEN, may be implemented for example by a pulse generator, and this can be easily embodied by those skilled in the art.

As described above, the page buffer 20_1 ensures a read margin through a method for latching the sensed value as data when the reference page buffer unit 30 finishes the sensing operation by the reference current IREF, or in other words, when the sensing output signal SAEN is activated.

However, the state of the flash memory cells varies depending on the change in process, voltage, and temperature (PVT), and thus current flowing to the bit line during the sensing operation may vary. Since the reference page buffer unit 30 uses predetermined memory cell current modeled by the reference current generation unit 40, it can not adjust the precise activation timing of the page buffer when the state of the flash memory cells varies depending on the change in PVT.

Figure 5:
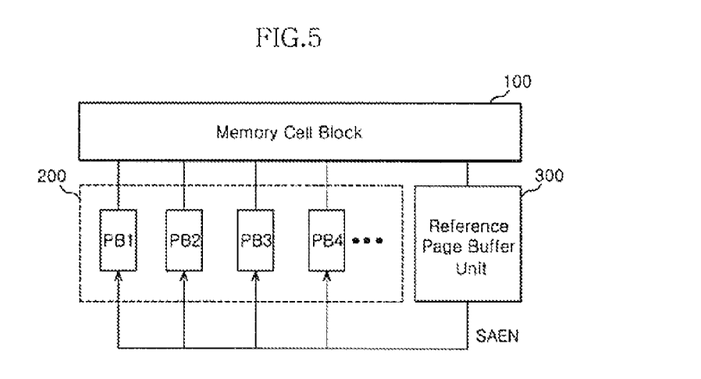
FIG. 5 is a diagram showing the configuration of a nonvolatile semiconductor memory apparatus in accordance with an embodiment of the present invention.

FIG. 5 is a diagram showing the configuration of a NAND flash memory apparatus in accordance with an embodiment of the present invention.

The NAND flash memory apparatus shown in FIG. 5 includes a memory cell block 100 including a dummy memory cell string, a page buffer unit 200, and a reference page buffer unit 300 configured to sense the dummy memory cell string and generate the sensing output signal SAEN.

The memory cell block 100 includes a plurality of memory cell strings as shown in FIG. 3, and additionally includes a dummy memory cell string (not illustrated). Dummy memory cell transistors included in the dummy memory cell string (not illustrated) may be set to have a predetermined level. For example, the dummy memory cell transistors may be preset with a value of "0".

The page buffer unit 200 is similar to the page buffer unit 20 as described above. The page buffer unit 200 includes a plurality of page buffers PB1, PB2, PB3, etc. that are connected to bit lines connected to the plurality of memory cell strings, and the activation timing of the plurality of page buffers PB1, PB2, PB3, etc. is adjusted in response to the sensing output signal SAEN. The activation timing refers to the timing to apply the values being sensed to the output node.

The reference page buffer unit 300 is configured to sense the dummy memory cell string (not illustrated) of the memory cell block 100 and to adjust the timing to activate the sensing output signal SEAN in response to the result of sensing. The reference page buffer unit 300 is connected to the bit line connected to the dummy memory cell string to sense the dummy memory cells.

Figure 6:
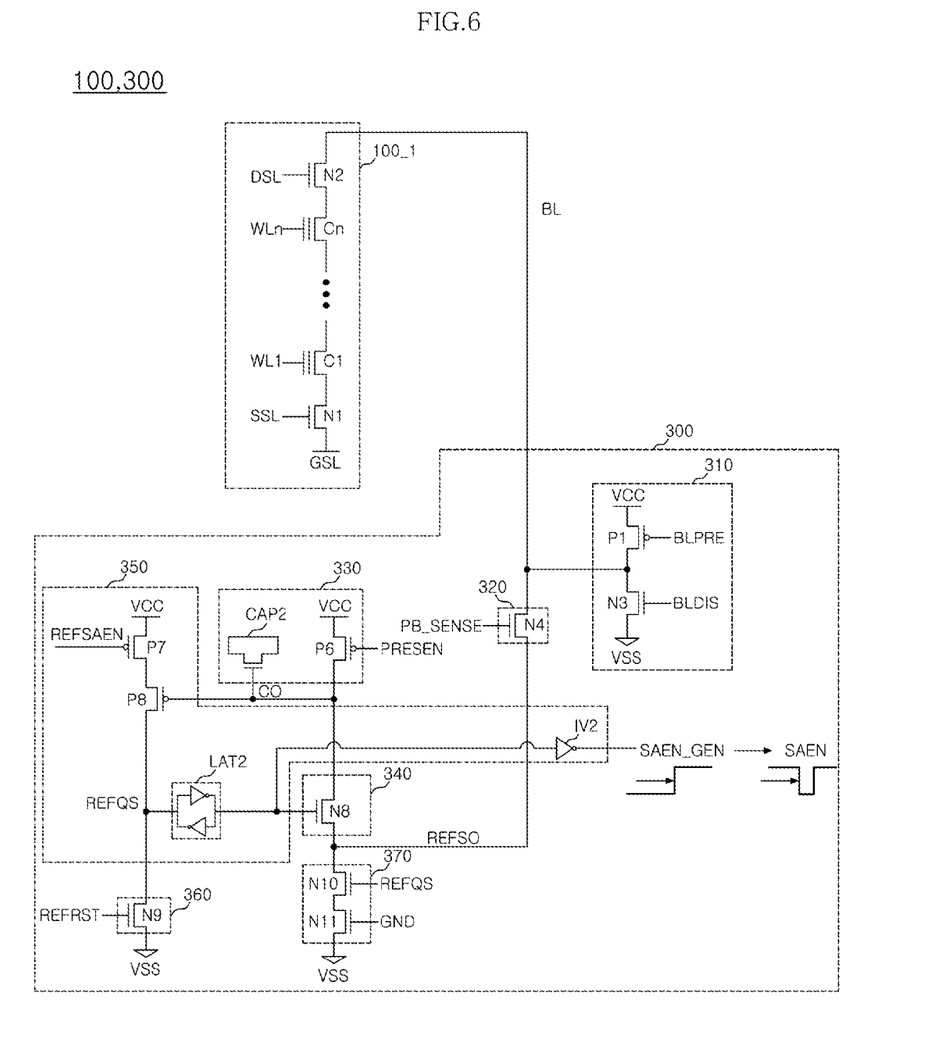
FIG. 6 is a circuit diagram showing the detailed configuration of the memory cell block and the reference page buffer unit shown in FIG. 5.

FIG. 6 is a circuit diagram showing the detailed configuration of the memory cell block 100 and the reference page buffer unit 300.

The memory cell block 100 is configured to include a plurality of memory cell strings (not illustrated) and a dummy memory cell string 100_1. As illustrated, the dummy memory cell string 100_1 includes a plurality of flash memory cell transistors C1 to Cn connected in series along the bit line BL in a similar manner as the typical memory cell string as described above. Word lines WL1 to WLn are connected to gate terminals of the corresponding cell transistors C1 to Cn, respectively. At both ends of the dummy memory cell string 100_1, control gates N1 and N2, which control cell string selection in response to selection signals DSL, SSL, and GSL, are connected.

The dummy memory cell string 100_1 is not a memory cell that is actually used to store the data, but is a dummy constituent element for generating a reference current that is used in the reference page buffer unit 300. Since the reference page buffer unit 300 actually generates the reference current through sensing of the data stored in the dummy memory cell transistors C1 to Cn, it can change the reference current value via the PVT effects that are actually exerted on the cell transistors.

The reference page buffer unit 300 may be a page buffer that is connected to the bit line BL connected to the dummy memory cell string 100_1. Specifically, the reference page buffer unit 300 includes a precharge unit 310, a switch unit 320, a precharging unit 330, a current pass unit 340, and an output unit 350.

The precharge unit 310 precharges or discharges the bit line BL with the level of the external voltage VCC in response to precharge signals BLPRE and BLDIS. Specifically, the precharge unit 310 includes precharge transistors P1 and N3 which apply the external voltage VCC or the ground voltage VSS to the bit line BL in response to the precharge signals BLPRE and BLDIS.

The switch unit 320 connects the bit line BL to a sensing node REFSO during the read operation. Specifically, the switch unit 320 includes a switch transistor N4 which is turned on in response to a sensing signal PB_SENSE that is activated during the read operation.

The precharging unit 330 includes a second capacitor CAP2, and charges the second capacitor CAP2 before the read operation is performed. The second capacitor CAP2 is used for sensing data stored in the dummy memory cell string. As described above, the capacitance of the second capacitor CAP2 is set to be equal to the capacitance of the first capacitor CAP1 included in the page buffer 200. This is because the sensing condition of the reference page buffer unit 300 must be equal to the sensing condition of the page buffer 200.

Specifically, the precharging unit 330 includes a charging transistor P6 which charges the second capacitor CAP2 through application of the external voltage VCC in response to the presensing signal PRESEN that is activated before the read operation is performed.

The current pass unit 340 senses the data through discharging of the charge stored in the second capacitor CAP2 in response to the voltage level of the sensing node REFSO. If the switch unit 340 is turned on during the read operation, current flows to the bit line BL in accordance with a preset data level of the dummy memory cell string and thus the voltage level of the sensing node REFSO is also changed.

Specifically, the current pass unit 340 includes a pass transistor N8. The drain terminal of the pass transistor N8 is connected to the second capacitor CAP2, and the source terminal thereof is connected to the sensing node REFSO. For initialization, a high level signal may be applied to the gate terminal of the pass transistor N8, and the charge that is stored in the second capacitor CAP2 is discharged in accordance with the voltage level of the sensing node REFSO.

The output unit 350 latches the sensed data in response to the reference sensing output signal REFSAEN that is activated in the predetermined timing and outputs the latched data to the output node REFQS. The output unit 350 activates the sensing output signal SAEN in response to the voltage level transition of the output node REFQS.

Specifically, the output unit 350 includes an output transistor P7, a sensing transistor P8, a latch unit LAT2, and an inverter IV2.

The output transistor P7 is turned on in response to the reference sensing output signal REFSAEN that is activated after a predetermined time elapses during the read operation, and applies the external voltage VCC.

The sensing transistor P8 is connected to the output transistor P7 and the output node REFQS, and is turned on in response to the voltage applied to the second capacitor CAP2, which is the voltage level of the charge node CO.

The latch unit LAT2 latches the data applied to the output node REFQS, and applies the inverted level of the data to the gate terminal of the pass transistor N8.

The inverter IV2 buffers and outputs the output of the latch unit LAT2.

The reference page buffer unit 300 may further include a reset unit 360.

The reset unit 360 initializes the output node REFQS to the level of the ground voltage VSS in response to the reset signal REFRST. Specifically, the reset unit 360 includes a reset transistor N9 that applies the ground voltage VSS to the output node REFQS in response to the reset signal REFRST.

The reset unit 360 may further include a configuration 370 that discharges the sensing node REFSO. In this embodiment, two discharge transistors N10 and N11 are illustrated. However, they are designed not to perform actual operations since one of them responds to the voltage level of the output node REFQS, and the other thereof responds to the ground voltage GND.

The detailed operation of the reference page buffer unit 300 will be described as follows.

Before the read operation, the second capacitor CAP2 receives the external voltage VCC to be charged accordingly. The bit line BL connected to the dummy memory cell string 100_1 is also precharged with the level of the external voltage VCC. Thereafter, during the read operation, current that actually senses the dummy memory cell flows to the bit line BL, and thus the voltage level of the sensing node REFSO is changed. Current flows to the pass transistor N8 in accordance with the voltage level of the sensing node REFSO, and thus the second capacitor CAP2 is discharged.

If the second capacitor CAP2 is completely discharged, an external voltage VSS is applied to the output node REFQS. Then, the level transition of the sensing output drive signal SAEN_GEN is performed when the voltage level of the output node REFQS is changed, and the sensing output signal SAEN is activated when the transition of the sensing output drive signal SAEN_GEN is performed. The generation of the sensing output signal SAEN, which is a pulse signal that is activated to a low level from the sensing output drive signal SAEN_GEN, may be implemented for example by a pulse generator, and this can be easily embodied by those skilled in the art.

The reference page buffer unit 300 activates the sensing output signal SAEN when the sensing of the dummy memory cell is complete.

The page buffer unit 200 in accordance with an embodiment of the present invention can ensure the read margin of the data with PVT effects by latching the sensed value as the data when the reference page buffer unit 30 finishes the sensing operation of the dummy memory cell, or in other words, when the sensing output signal SAEN is activated.

Figure 7:
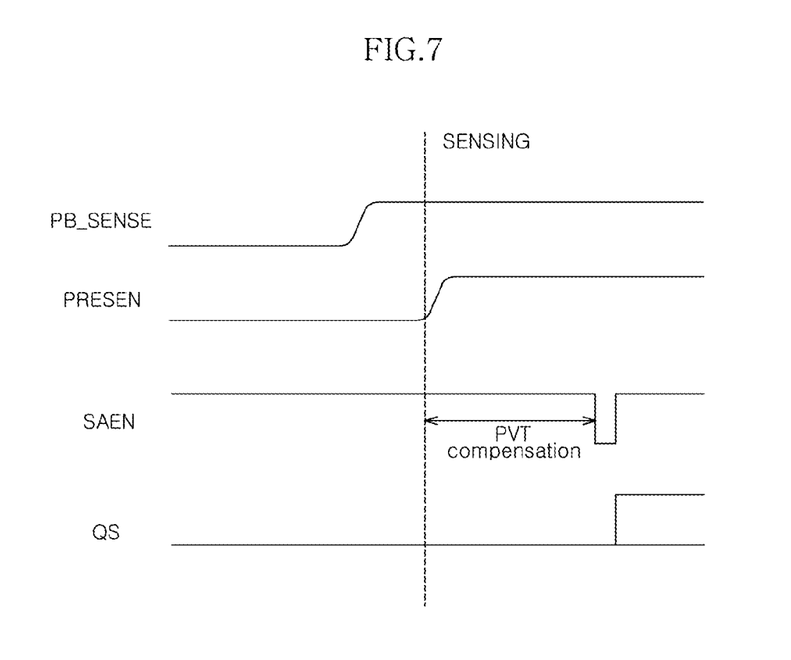
FIG. 7 is a waveform diagram showing a data sensing method in accordance with the nonvolatile semiconductor memory apparatus shown in FIG. 5.

FIG. 7 is a waveform diagram showing a data sensing method in accordance with the nonvolatile semiconductor memory apparatus shown in FIG. 5.

The nonvolatile semiconductor memory apparatus in accordance with an embodiment of the present invention first activates the sensing signal PB_SENSE to sense the data stored in the memory cell. The page buffer unit 200 for sensing the memory cell 100 is activated, and the presensing signal PRESEN for charging capacitors included in the page buffer unit 200 and the reference page buffer unit 300 is deactivated.

The reference page buffer unit 300 senses the dummy memory cell 100_1 in a method for discharging the capacitor. If the discharge of the capacitor included in the reference page buffer unit 300 reaches a predetermined value, the sensing output signal SAEN is activated. As a result, the time during which errors due to the PVT effects from when the presensing signal PRESEN is deactivated to a when the sensing output signal SAEN is activated can be compensated. If the sensing output signal SAEN is activated, the page buffer outputs the value obtained by sensing the memory cell 100 to the output node QS.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A nonvolatile semiconductor memory apparatus comprising:
 a memory cell block configured to include a plurality of memory cell strings each of which including a plurality of memory cells, a dummy memory cell string which includes a plurality of dummy memory cells, and a plurality of bit lines connected to the plurality of cell strings and the dummy memory cell string;
 a plurality of page buffers configured to be connected to any one of the plurality of bit lines that are connected to the memory cell strings in response to a sensing signal to sense data stored in the memory cells, latch the data, and apply the latched data to an output node in response to a sensing output signal and including a first capacitor; and
 a reference page buffer unit configured to be connected to the bit line connected to the dummy memory cell string in response to the sensing signal to sense the dummy memory cells and activate the sensing output signal,
 wherein the sensing signal is activated after a precharge signal for precharging the bit line and a presensing signal for charging the first capacitor are activated.

2. The nonvolatile semiconductor memory apparatus according to claim 1, wherein the page buffer is configured to sense a level of the data in response to a discharge of the first capacitor in accordance with a voltage level of the bit line.

3. The nonvolatile semiconductor memory apparatus according to claim 2, wherein the page buffer comprises:
 a precharge unit configured to precharge the bit line in response to the precharge signal;
 a precharging unit configured to charge the first capacitor in response to the presensing signal;
 a switch unit configured to connect a sensing node to the bit line in response to the sensing signal;
 a current pass unit configured to sense the data via discharging the first capacitor in response to a voltage level of the sensing node; and
 an output unit configured to latch the sensed data and apply the latched data to the output node in response to the sensing output signal.

4. The nonvolatile semiconductor memory apparatus according to claim 3, wherein the page buffer further comprises:
 a reset unit that applies ground voltage to the output node; and
 a discharge unit that applies the ground voltage to the sensing node.

5. The nonvolatile semiconductor memory apparatus according to claim 3, wherein the current pass unit comprises a charge node of which the voltage level is determined in accordance with the charge stored in the first capacitor.

6. The nonvolatile semiconductor memory apparatus according to claim 5, wherein the output unit outputs and latches the data in the output node in accordance with the voltage level of the charge node if the activated sensing output signal is applied.

7. The nonvolatile semiconductor memory apparatus according to claim 1, wherein the reference page buffer unit comprises a second capacitor having the same capacitance as the first capacitor, and adjusts activation timing of the sensing output signal in response to a discharge of the second capacitor in accordance with the voltage level of the bit line.

8. The nonvolatile semiconductor memory apparatus according to claim 7, wherein the reference page buffer unit comprises:
 a reference precharge unit configured to precharge the bit line in response to the precharge signal;
 a reference precharging unit configured to charge the second capacitor in response to the presensing signal;
 a reference switch unit configured to connect a reference sensing node to the bit line in response to the sensing signal;
 a reference current pass unit configured to discharge the second capacitor in response to a voltage level of the reference sensing node; and
 a sensing output signal generation unit configured to activate the sensing output signal if the second capacitor is discharged.

9. The nonvolatile semiconductor memory apparatus according to claim 8, wherein the reference page buffer unit further comprises:
 a reset unit that applies ground voltage to the reference sensing node; and
 a discharge unit that discharges the reference sensing node.

10. The nonvolatile semiconductor memory apparatus according to claim 9, wherein the reference current pass unit comprises a reference charge node of which the voltage level is determined in accordance with the charge stored in the second capacitor.

11. The nonvolatile semiconductor memory apparatus according to claim 10, wherein the sensing output signal generation unit is configured to activate the sensing output signal in response to the voltage level of the reference charge node.

12. A nonvolatile semiconductor memory apparatus comprising:
 a memory cell block configured to include a plurality of memory cell strings each of which including a plurality of memory cells, a dummy memory cell string which includes a plurality of dummy memory cells, and a plurality of bit lines connected to the plurality of cell strings and the dummy memory cell string;
 a plurality of page buffers configured to be connected to any one of the plurality of bit lines that are connected to the memory cell strings in response to a sensing signal to sense data stored in the memory cells, latch the data, and apply the latched data to an output node in response to a sensing output signal; and
 a reference page buffer unit configured to be connected to the bit line connected to the dummy memory cell string in response to the sensing signal to sense the dummy memory cells and activate the sensing output signal,
 wherein each of the plurality of page buffers includes a first capacitor and the reference page buffer unit includes a second capacitor having a capacitance which is same with a capacitance of the first capacitor, and the reference page buffer unit has a configuration which is substantially same with a configuration of the page buffer, and
 wherein the sensing signal is activated after a precharge signal for precharging the bit line and a presensing signal for charging the first capacitor are activated.

13. The nonvolatile semiconductor memory apparatus according to claim 12, wherein the reference page buffer unit is configured to adjust activation timing of the sensing output signal in response to a discharge of the second capacitor in accordance with a voltage level of the bit line.

14. The nonvolatile semiconductor memory apparatus according to claim 12, wherein the sensing output signal is activated according to a charging level of the second capacitor.

\* \* \* \* \*